(12) United States Patent
Wang et al.

(10) Patent No.: US 12,100,670 B2
(45) Date of Patent: Sep. 24, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Mengmeng Wang, Hefei (CN); Hsin-Pin Huang, Hefei (CN); Qiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 336 days.

(21) Appl. No.: 17/582,147

(22) Filed: Jan. 24, 2022

(65) Prior Publication Data

US 2022/0310534 A1 Sep. 29, 2022

Related U.S. Application Data

(63) Continuation of application No. PCT/CN2021/112330, filed on Aug. 12, 2021.

(30) Foreign Application Priority Data

Mar. 26, 2021 (CN) .......................... 202110323584.6

(51) Int. Cl.
*H01L 23/522* (2006.01)
*H01L 21/764* (2006.01)
(Continued)

(52) U.S. Cl.
CPC .......... *H01L 23/562* (2013.01); *H01L 21/764* (2013.01); *H01L 21/76877* (2013.01); *H01L 23/5226* (2013.01); *H01L 23/5283* (2013.01)

(58) Field of Classification Search
None
See application file for complete search history.

(56) References Cited

U.S. PATENT DOCUMENTS 5,776,826 A 7/1998 Mitwalsky
6,753,608 B2 6/2004 Tomita
(Continued)

FOREIGN PATENT DOCUMENTS

CN 1476072 A 2/2004
CN 1738008 A 2/2006
(Continued)

OTHER PUBLICATIONS

Machine-generated English translation of CN 108788486A (Year: 2018).*

(Continued)

*Primary Examiner* — Bo B Jang
(74) *Attorney, Agent, or Firm* — Kilpatrick Townsend & Stockton LLP

(57) ABSTRACT

The disclosure provides a method for manufacturing a semiconductor structure and the semiconductor structure. The method for manufacturing the semiconductor structure comprises: a substrate, in which a first protective structure is formed, is provided; a first dielectric layer is formed on the substrate; and a second protective structure is formed in the first dielectric layer and the substrate. A projection of the second protective structure and a projection of the first protective structure in a direction perpendicular to a surface of the substrate are at least partially overlapped, and there is a spacing between a projection of the second protective structure and a projection of the first protective structure in a direction along the surface of the substrate.

9 Claims, 11 Drawing Sheets

(51) Int. Cl.
 *H01L 21/768* (2006.01)
 *H01L 23/00* (2006.01)
 *H01L 23/528* (2006.01)

(56) References Cited

U.S. PATENT DOCUMENTS

| | | | |
|---|---|---|---|
| 9,123,730 | B2 | 9/2015 | Kuo et al. |
| 2004/0026785 | A1 | 2/2004 | Tomita |
| 2006/0038297 | A1* | 2/2006 | Usami .................. H01L 23/562 |
| | | | 257/E23.142 |
| 2008/0099884 | A1 | 5/2008 | Inohara |
| 2011/0068466 | A1 | 3/2011 | Chen |
| 2015/0014828 | A1 | 1/2015 | Kuo et al. |
| 2015/0171025 | A1 | 6/2015 | Shao et al. |
| 2018/0315707 | A1 | 11/2018 | Fox, III et al. |
| 2020/0176359 | A1 | 6/2020 | Chen et al. |

FOREIGN PATENT DOCUMENTS

| | | | |
|---|---|---|---|
| CN | 101770992 | A | 7/2010 |
| CN | 102024781 | A | 4/2011 |
| CN | 105870069 | A | 8/2016 |
| CN | 108788486 | A | 11/2018 |
| CN | 111480226 | A | 7/2020 |
| CN | 111564411 | A | 8/2020 |
| CN | 111900131 | A | 11/2020 |
| CN | 113078109 | A | 7/2021 |
| CN | 113078140 | A | 7/2021 |
| JP | 2005203476 | A | 7/2005 |
| JP | 2006005011 | A | 1/2006 |
| JP | 2008112825 | A | 5/2008 |
| KR | 20140008552 | A | 1/2014 |
| KR | 20180121737 | A | 11/2018 |

OTHER PUBLICATIONS

First Office Action of the Chinese application No. 202110323584.6, issued on Dec. 3, 2021, 12 pgs.
First Office Action of the Chinese application No. 202110323591.6, issued on Apr. 22, 2022, 15 pgs.
Notice of Allowance of the Chinese application No. 202110323551.1, issued on Feb. 23, 2022, 2 pgs.

* cited by examiner

METHOD FOR MANUFACTURING SEMICONDUCTOR STRUCTURE AND SEMICONDUCTOR STRUCTURE

CROSS-REFERENCE TO RELATED APPLICATIONS

The present application is a U.S. continuation application of International Application No. PCT/CN2021/112330, filed on Aug. 12, 2021, which claims priority to Chinese Patent Application No. 202110323584.6, filed on Mar. 26, 2021. International Application No. PCT/CN2021/112330 and Chinese Patent Application No. 202110323584.6 are incorporated herein by reference in their entireties.

TECHNICAL FIELD

The disclosure relates to the technical field of semiconductor manufacturing processes, and in particular to a method for manufacturing a semiconductor structure and a semiconductor structure.

BACKGROUND

In the manufacturing process of a chip, a protective structure needs to be arranged around the chip to prevent the chip from damaging during a wafer cutting. However, an existing protective structure is easy to generate electromagnetic induction during the chip operation, thereby affecting the normal operation of the chip.

SUMMARY

An aspect of the embodiment of the disclosure provides a method for manufacturing a semiconductor structure. The method includes following operations. A substrate, in which a first protective structure is formed, is provided. A first dielectric layer is formed on the substrate. A second protective structure is formed in the first dielectric layer and the substrate. The projection of the second protective structure and the projection of the first protective structure in the direction perpendicular to the surface of the substrate are at least partially overlapped. There is a spacing between the projection of the second protective structure and the projection of the first protective structure in the direction along the surface of the substrate.

Another aspect of the embodiment of the disclosure provides a semiconductor structure. The semiconductor structure includes: a substrate and a first dielectric layer. A first protective structure is formed in the substrate. The first dielectric layer is located on the substrate. A second protective structure is formed in the first dielectric layer. The projection of the second protective structure and the projection of the first protective structure in the direction perpendicular to the surface of the substrate are at least partially overlapped. There is a spacing between the projection of the second protective structure and the projection of the first protective structure in the direction along the surface of the substrate.

DETAILED DESCRIPTION

Figure 1:
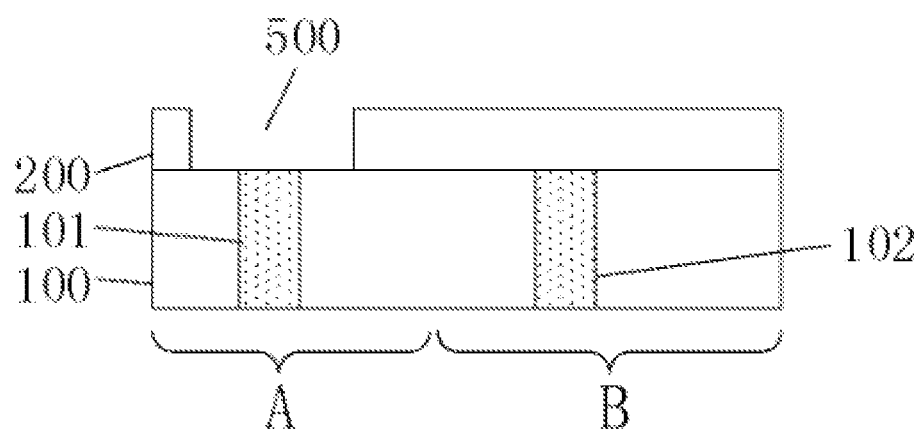
FIG. 1 to FIG. 3 are respectively schematic diagrams of a semiconductor structure under several operations of a method for manufacturing a semiconductor structure shown according to an exemplary embodiment.

Exemplary embodiments will now be described more comprehensively with reference to the drawings. However, the exemplary embodiments may be implemented in various forms, and should not be understood to be limited to embodiments elaborated herein. Instead, these embodiments are provided to make the disclosure comprehensive and complete and comprehensively communicate the ideas of the exemplary embodiments to those skilled in the art. The same signs in the drawings show same or similar structures, so that detailed description of them are omitted.

Figure 2:
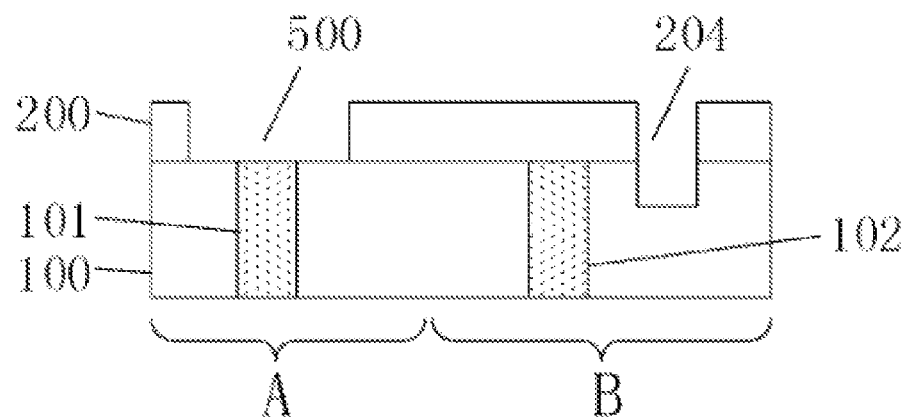
Figure 3:
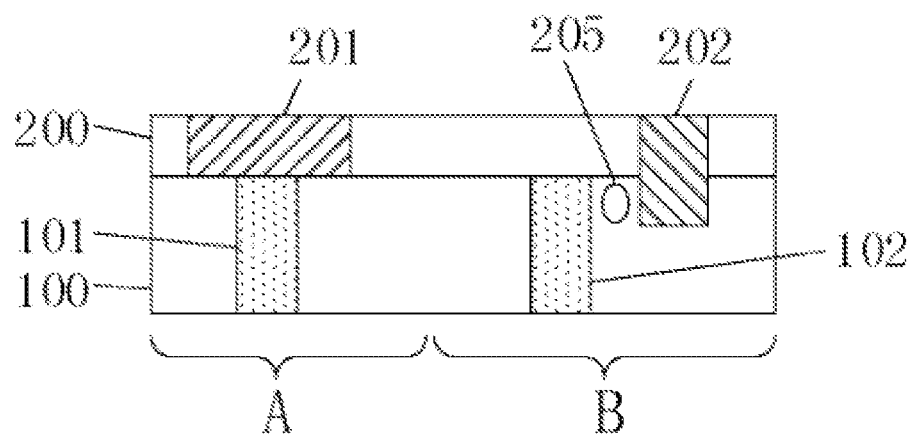

As shown in FIG. 1 to FIG. 3, in the embodiment, a method for manufacturing a semiconductor structure provided in the disclosure at least includes the following operations.

A substrate 100 is provided. A first protective structure 102 is formed in the substrate 100.

A first dielectric layer 200 is formed on the substrate 100.

A second protective structure 202 is formed in the first dielectric layer 200 and the substrate 100.

The projection of the second protective structure 202 and the projection of the first protective structure 102 in the direction perpendicular to the surface of the substrate 100 are at least partially overlapped. There is a spacing between the projection of the second protective structure 202 and the projection of the first protective structure 102 in the direction along the surface of the substrate 100.

By forming the first protective structure 102 and the second protective structure 202 that are not in direct contact, the disclosure can reduce the electromagnetic induction generated in the protective structure during chip operation, and therefore reduce the interference to the normal operation of a chip due to the electromagnetic induction, thereby improving the performance of the chip.

As shown in FIG. 1, the material of the substrate 100 may include an oxide material, such as but not limited to silicon dioxide ($SiO_2$) The material of the substrate 100 may also include a semiconductor substrate, such as silicon, germanium, gallium nitride, gallium carbide and the like. The substrate 100 may include a chip area A and a peripheral area B. In the chip area A, a chip structure, such as a transistor and a metal interconnection layer, may be formed. For example, as shown in FIG. 1, a first connecting member 101 is formed in the chip area A. For example, the first connecting member 101 may be a metal interconnection plug. The peripheral area B is arranged around the chip area A. The protective structure may be arranged in the peripheral area B. For example, the first protective structure 102 and the second protective structure 202 may be arranged in the peripheral area. The first protective structure 102 and the second protective structure 202 may be arranged around the chip area. The materials of the first protective structure 102 and the second protective structure 202 include metals, such as but not limited to tungsten (W), copper (Cu) or aluminum (AL). The spacing between the projection of the second protective structure 202 and the projection of the first protective structure 102 in the direction along the surface of the substrate 100 is less than 5 µm. For example, the projection of the second protective structure 202 and the projection of the first protective structure 102 in the direction along the surface of the substrate 100 do not intersect. The spacing between the two projections is less than 5 µm. The distance between the two projections may be understood as the distance between the adjacent edges of the two projections. For example, the spacing is 0.5 µm, 1 µm, 1.5 µm, 2 µm, 2.5 µm, 3 µm, 3.5 µm, 4 µm or 4.5 µm.

In some embodiments, the spacing is ranging from 0.5 µm to 2.5 µm. A long distance will occupy a relatively large peripheral area. A short distance setting is too small will not effectively reduce the electromagnetic induction, and will reduce the protection effect of the protective structure.

As shown in FIG. 1, the first dielectric layer 200 is formed on the substrate 100. The material of the first dielectric layer 200 includes, but is not limited to, silicon oxide, silicon nitride or low-k materials. Exemplarily, a first chip opening 500 is also formed in the first dielectric layer 200. For example, the first chip opening 500 is formed in the first dielectric layer 200 by a photoetching process. The first chip opening 500 exposes the first connecting member 101.

As shown in FIG. 2, a first protective opening 204 is formed in the first dielectric layer 200 and the substrate 100. The first protective opening 204 penetrates through the first dielectric layer 200. The bottom of the first protective opening 204 extends into the substrate 100. For example, the first protective opening 204 may be formed in the first dielectric layer 200 by the photoetching process. The depth of the first protective opening 204 extending into the substrate 100 is controlled by the etching time. For example, the depth at which the first protective opening 204 extends into the substrate 100 is controlled to be ½ to ⅕ of the height of the first protective structure 102 in the substrate. The projection of the first protective opening 204 and the projection of the first protective structure 102 in the direction perpendicular to the surface of the substrate 100 are at least partly overlapped. For example, the top of the first protective structure 102 is flush with the upper surface of the substrate 100, and the bottom of the first protective opening 204 is lower than the upper surface of the substrate 100. The projection of the first protective opening 204 has a spacing with the projection of the first protective structure 102 in the direction along the surface of the substrate 100. For example, the first protective opening 204 does not expose the first protective structure 102.

As shown in FIG. 3, the second protective structure 202 is formed in the first dielectric layer 200 and the substrate 100. For example, a conductive material, such as W, AL or Cu, may be formed on the first protective opening 204 and the first dielectric layer 200 by chemical vapor deposition (CVD), physical vapor deposition (PVD) and other deposition processes. The conductive material above the first dielectric layer 200 is removed by means of back etching or chemical mechanical polishing. The conductive material retained in the first protective opening 204 forms the second protective structure 202.

In some embodiments, as shown in FIG. 3, the conductive material may be formed in the first chip opening 500, the first protective opening 204 and the first dielectric layer 200 at the same time. The conductive material above the first dielectric layer 200 is removed by means of back etching or chemical mechanical polishing. The conductive material retained in the first chip opening 500 and the first protective opening 204 forms a second connecting member 201 and the second protective structure 202 respectively. In other examples, the second connecting member 201 and the second protective structure 202 may be formed separately. The materials of the second connecting member 201 and the second protective structure 202 may be different. For example, the material of the second connecting member 201 is W, and the material of the second protective structure 202 is AL. For example, the second connecting member 201 may be an interconnection line. The first connecting member 101 and the second connecting member 201 are electrically connected.

In some embodiments, as shown in FIG. 3, a first air gap 205 is formed between the first protective structure 102 and the second protective structure 202. For example, the first air gap 205 may be located in an overlapping area of the first protective structure 102 and the second protective structure 202 in the direction perpendicular to the surface of the substrate 100. As shown in FIG. 3, the first air gap 205 is located in the upper part of the substrate 100. The bottom of the first air gap 205 is higher than the bottom of the second protective structure 202, and the top of the first air gap 205 is lower than the top of the first protective structure 102. By doing so, the first air gap 205 can further reduce the parasitic effect in the second protective structure 202, and improve the device performance Meanwhile, it can prevent the protective structure from becoming fragile due to an excessive air gap.

For example, a method for forming the first air gap 205 may include following operations. After the second protective structure 202 is formed, a photoresist opening pattern may be formed on the first dielectric layer 200. The projection of the photoresist opening pattern on the surface of the substrate 100 is located between the projection of the first protective structure 102 and the projection of the second protective structure 202 on the surface of the substrate 100. The first dielectric layer 200 and part of the substrate 100 are etched by using the photoresist opening pattern to form a first air gap opening. An isolation layer is filled in the first air gap opening. The first air gap 205 is formed in the isolation layer. For example, the isolation layer made of silicon nitride with the first air gap 205 is formed in the first air gap opening by CVD.

Figure 4:
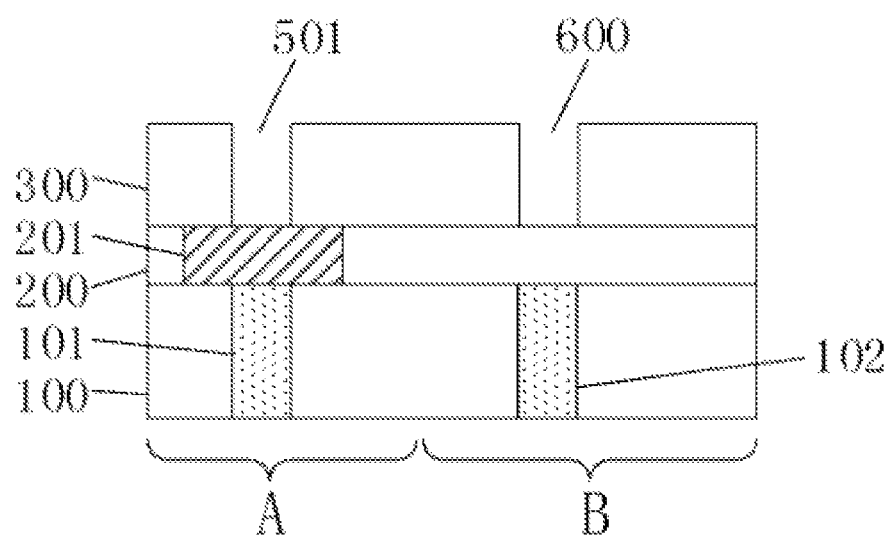
FIG. 4 to FIG. 8 are respectively schematic diagrams of a semiconductor structure under several operations of a method for manufacturing a semiconductor structure shown according to another exemplary embodiment.
Figure 5:
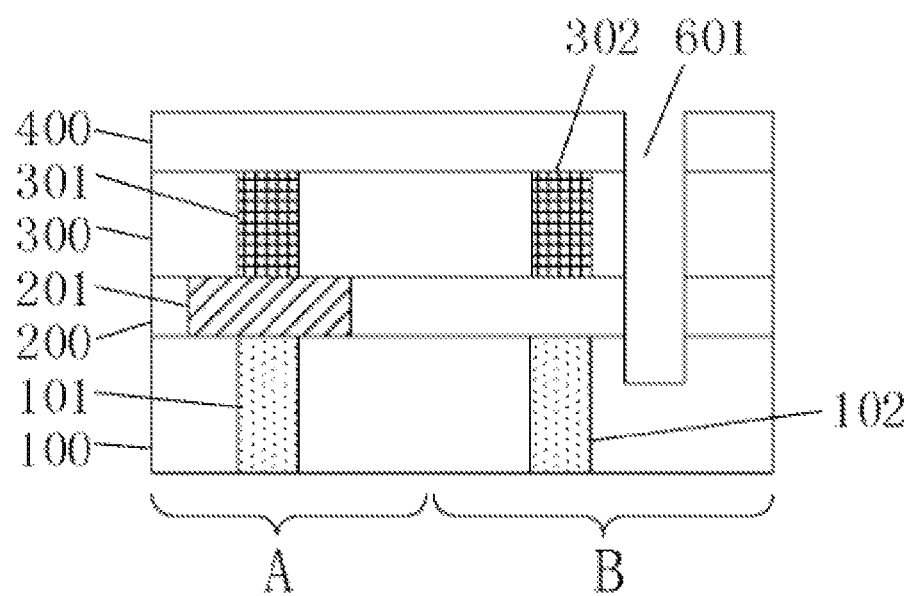

In some embodiments, a method for manufacturing a semiconductor structure further includes following operations. A second dielectric layer 300 is formed on the first dielectric layer 200. A third protective structure 302 is formed in the second dielectric layer 300. The projection of the third protective structure 302 and the projection of the second protective structure 202 in the direction perpendicular to the surface of the substrate 100 are at least partially overlapped. The projection of the third protective structure 302 and the first protective structure 102 in the direction along the surface of the substrate 100 are at least partially overlapped. By doing so, the area occupied by the protective structure can be saved, and furthermore, the protection effect can be ensured. For example, as shown in FIG. 4, the second dielectric layer 300 is formed on the first dielectric layer 200. For example, the second dielectric layer 300 may be formed on the first dielectric layer 200 by a PVD or CVD process. The second dielectric layer 300 includes a silicon nitride layer, a silicon oxide layer, or Low-K dielectric layer, etc. A second chip opening 501 and a second protective opening 600 are formed in the second dielectric layer 300 by the photoetching process. The second chip opening 501 exposes the second connecting member 201. The opening width of the second chip opening 501 is less than the width of the second connecting member 201. The second protective opening 600 is located above the first protective structure 102. The projection of the second protective opening 600 and the projection of the first protective structure 102 in the direction along the surface of the substrate 100 are at least partially overlapped. For example, the projection of the second protective opening 600 and the projection of the first protective structure 102 in the direction along the surface of the substrate 100 are overlapped, that is, the width of the second protective opening 600 and the first protective structure 102 are the same. The width may be understood as the lengths of the second chip opening 501, the second connecting member 201, the second protective opening 600 and the first protective structure 102 in the direction along the surface of the substrate 100. As shown in FIG. 5, a third connecting member 301 and a third protective structure 302 are formed in the second chip opening 501 and the second protective opening 600 respectively. The width of the third connecting member 301 is less than that of the second connecting member 201. The third connecting member 301 and the second connecting member 201 are electrically connected. For example, the third connecting member 301 and the third protective structure 302 may be respectively formed in the second chip opening 501 and the second protective opening 600 by electroplating, CVD or PVD, etc. The materials of the third connecting member 301 and the third protective structure 302 may be the same, such as Cu, AL or W. In other examples, the materials of the third connecting member 301 and the third protective structure 302 may also be different.

Figure 6:
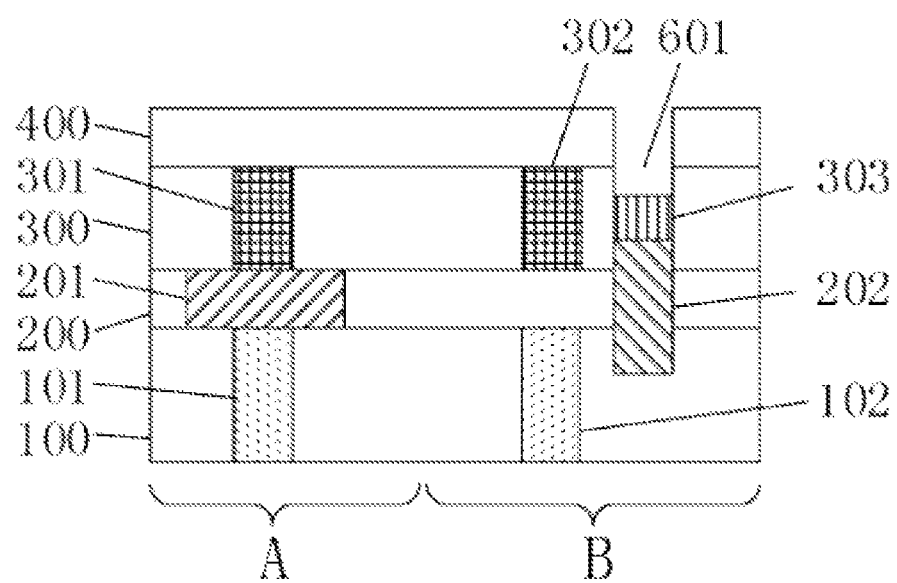
Figure 7:
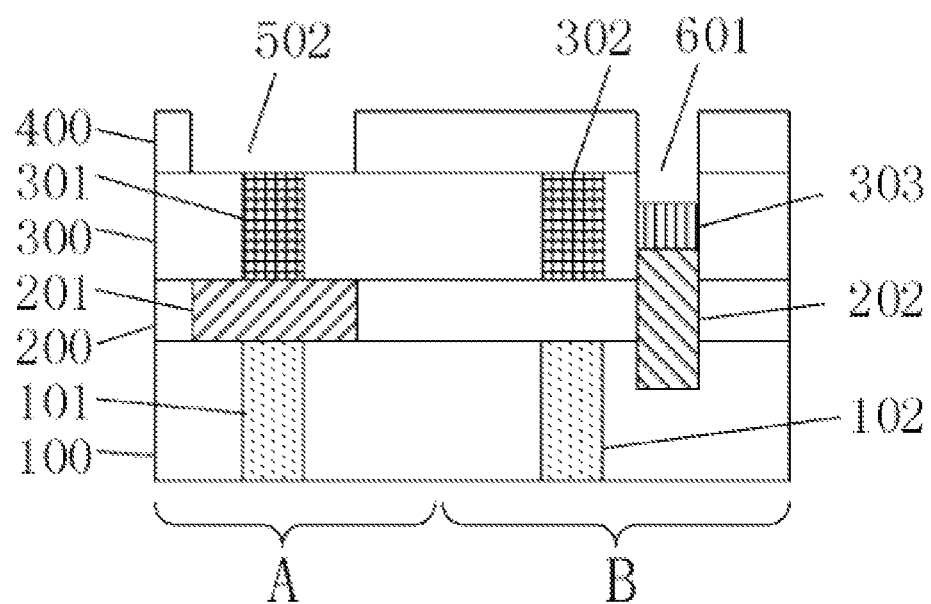
Figure 8:
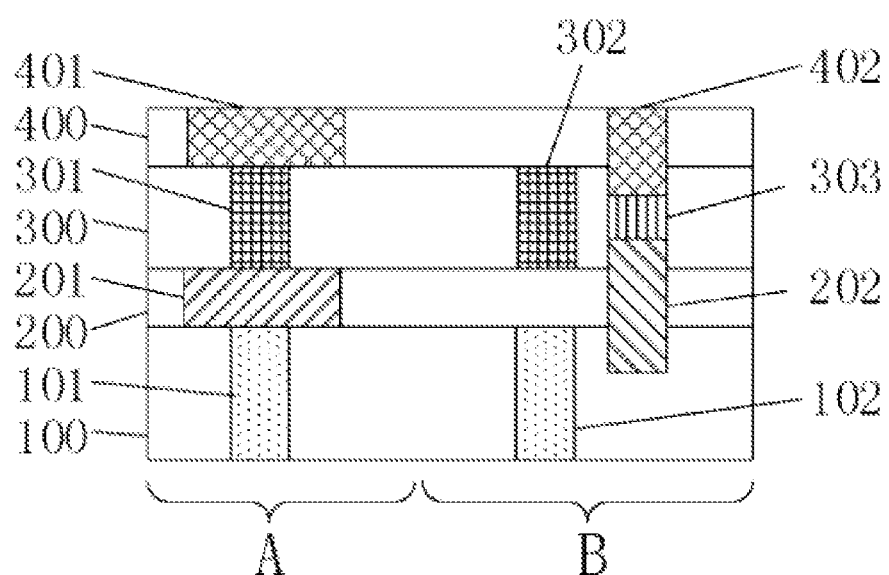

As shown in FIG. 6 to FIG. 8, a third dielectric layer 400 is formed on the second dielectric layer 300. The material of the third dielectric layer 400 includes, but is not limited to, silicon nitride, silicon oxide, etc. A fourth protective structure 402 is formed in the third dielectric layer 400 and the second dielectric layer 300. The projection of the fourth protective structure 402 and the projection of the third protective structure 302 in the direction perpendicular to the surface of the substrate 100 are at least partially overlapped. The projection of the fourth protective structure 402 and the projection of the second protective structure 202 in the direction along the surface of the substrate 100 are at least partially overlapped.

For example, the operation that the second protective structure 202 is formed in the first dielectric layer 200 and the substrate 100 and the operation that the fourth protective structure 402 is formed in the third dielectric layer 400 and the second dielectric layer 300 include following operations.

As shown in FIG. 5, a third protective opening 601 is formed in the third dielectric layer 400, the second dielectric layer 300 and the first dielectric layer 200. The third protective opening 601 penetrates through the third dielectric layer 400, the second dielectric layer 300 and the first dielectric layer 200. The bottom of the third protective opening 601 is located in the substrate 100. For example, the third protective opening 601 may be formed by photoetching and etching processes. The depth of the third protective opening 601 in the substrate 100 may be adjusted by setting the etching time.

The third protective opening 601 is filled with a conductive material to form the second protective structure 202. For example, as shown in FIG. 6, a tungsten metal material layer may be formed in the third protective opening 601 and on the third dielectric layer 400 by CVD or the like. The tungsten metal layer on the third dielectric layer 400 and part of the tungsten metal layer in the third protective opening 601 are removed by a back etching process. The retained tungsten metal layer forms the second protective structure 202. Meanwhile, the projection of the second protective structure 202 needs to be at least partially overlapped with both the projection of the first protective structure 102 and the projection of the third protective structure 302 in the direction perpendicular to the surface of the substrate.

As shown in FIG. 7, an insulating layer 303 is formed on the second protective structure 202. For example, an insulating material layer may be formed on the second protective structure 202 in the third protective opening 601 and on the third dielectric layer 400 by CVD, PVD, etc. The material of the insulating material layer includes, but is not limited to, silicon nitride, silicon oxide, etc. Part of the insulating material layer in the third protective opening 601 and the insulating material layer on the third dielectric layer 400 are removed by the back etching process to form the insulating layer 303. The top of the insulating layer 303 is lower than the top surface of the third protective structure 302. The bottom surface of the insulating layer 303 is higher than the bottom surface of the third protective structure 302.

As shown in FIG. 8, the fourth protective structure 402 is formed on the insulating layer 303. For example, a tungsten metal material layer may be formed on the insulating layer 303 in the third protective opening 601 and on the third dielectric layer 400 by CVD, PVD, etc. Part of the tungsten metal material layer on the third dielectric layer 400 is removed by a back etching or chemical mechanical polishing process. The tungsten metal material layer retained in the third protective opening 601 forms the fourth protective structure 402. Exemplarily, a third chip opening 502 is also formed in the third dielectric layer 400. The tungsten metal material layer is also formed in the third chip opening 502. Part of the tungsten metal material layer on the third dielectric layer 400 is removed by the back etching or chemical mechanical polishing process. The tungsten metal material layer retained in the third chip opening 502 forms a fourth connecting member 401. For example, the width of the fourth connecting member 401 is greater than that of the third connecting member 301. The fourth connecting member 401 and the third connecting member 301 are electrically connected.

In some embodiments, the first connecting member 101, the second connecting member 201, the third connecting member 301 and the fourth connecting member 401, which are electrically connected, are respectively and sequentially formed in the substrate 100, the first dielectric layer 200, the second dielectric layer 300 and the third dielectric layer 400 of the chip area A.

The width of the third connecting member 301 is less than that of the second connecting member 201 and that of the fourth connecting member 401. The second protective structure 202 and the fourth protective structure 402 are formed at a side away from the chip area A. The third protective structure 302 is formed at a side close to the chip area A. By doing so, the distance between the connecting member in the chip area and the protective structure in the peripheral area can be increased, and the electromagnetic induction generated in the protective structure during chip operation can be further weakened.

Figure 9:
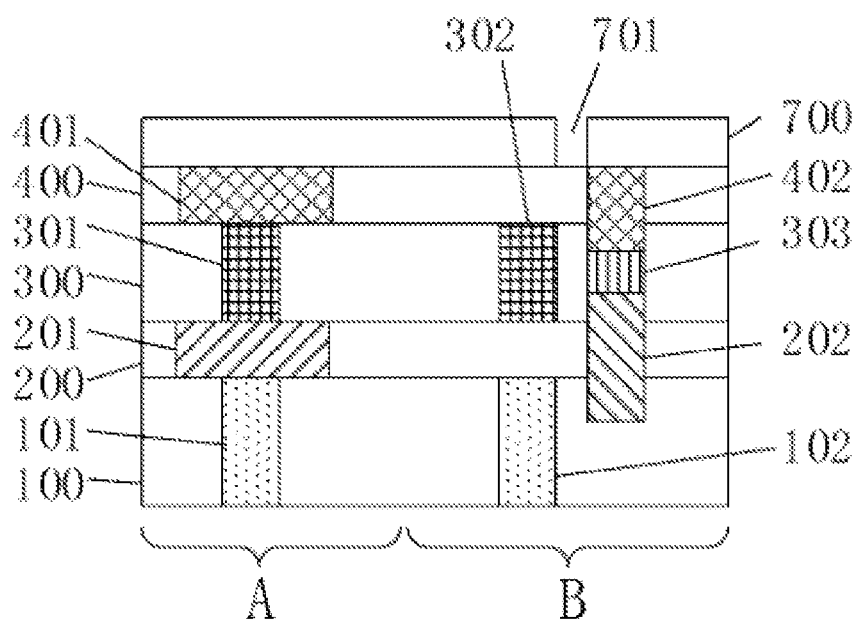
FIG. 9 to FIG. 11 are respectively schematic diagrams of a semiconductor structure under several operations of a method for manufacturing a semiconductor structure shown according to another exemplary embodiment.
Figure 10:
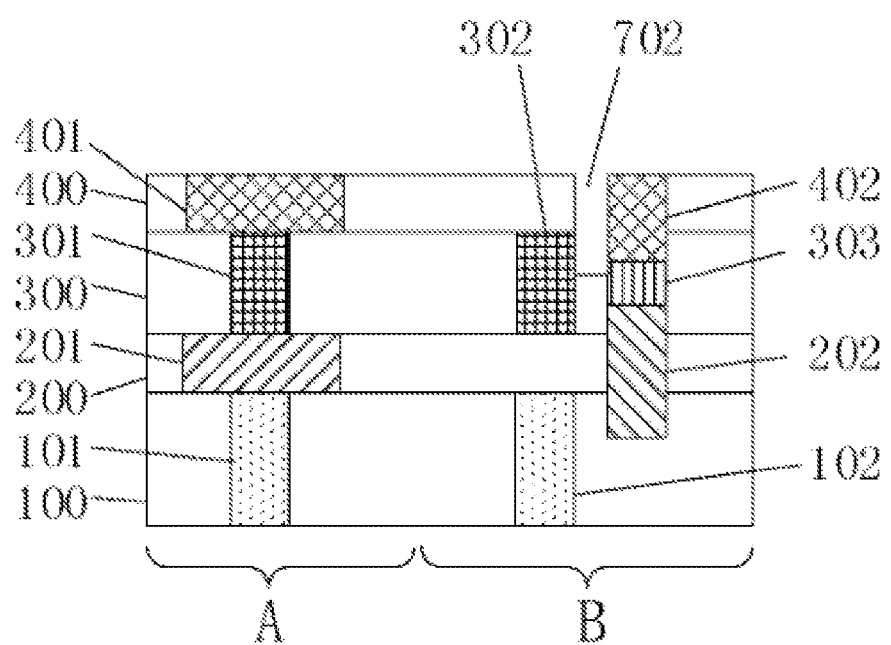
Figure 11:
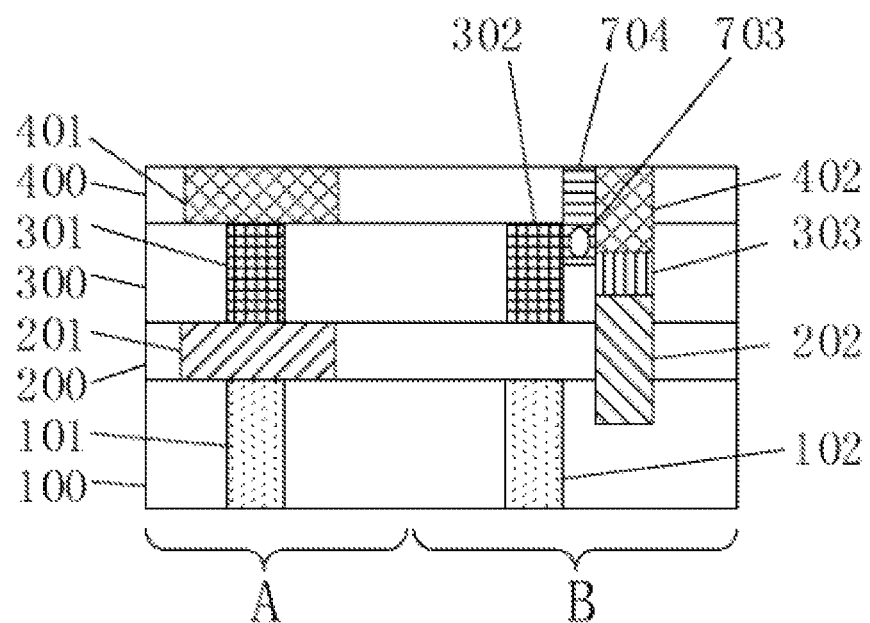

In some embodiments, a second air gap 703 is formed between the fourth protective structure 402 and the third protective structure 302. For example, as shown in FIG. 9 to FIG. 11, a mask layer 700 is formed on the third dielectric layer 400. The mask layer 700 has an air gap opening pattern 701, and the mask layer 700 may be photoresist. The projection of the air gap opening pattern 701 on the surface of the substrate 100 is located between the projection of the third protective structure 302 and the projection of the fourth protective structure 402 on the surface of the substrate 100. The third dielectric layer 400 and part of the second dielectric layer 300 are etched by using the air gap opening pattern 701 to form a second air gap opening 702. An isolation layer 704 is filled in the second air gap opening 702. A second air gap 703 is formed in the isolation layer 704. For example, a silicon nitride layer with the second air gap 703 is formed in the second air gap opening 702 by a CVD process. The second air gap 703 can further reduce the parasitic effect in the fourth protective structure 402 and improve the device performance.

Moreover, the specific embodiment further provides a semiconductor structure. The semiconductor structure provided in the specific embodiment may refer to FIG. 3, FIG. 8 and FIG. 11. The semiconductor structure may be formed by the method as shown in FIG. 1 to FIG. 11. The semiconductor structure may include a substrate 100 and a first dielectric layer 200.

A first protective structure 102 is formed in the substrate 100.

The first dielectric layer 200 is located on the substrate 100. A second protective structure 202 is formed in the first dielectric layer 200.

The projection of the second protective structure 202 and the projection of the first protective structure 102 in the direction perpendicular to the surface of the substrate 100 are at least partially overlapped. There is a spacing between the projection of the second protective structure 202 and the projection of the first protective structure 102 in the direction along the surface of the substrate 100.

In some embodiments, the semiconductor structure also includes a first air gap 205. The first air gap 205 is located between the first protective structure 102 and the second protective structure 202.

In some embodiments, the substrate 100 includes a chip area A and a peripheral area B. The first protective structure 102 and the second protective structure 202 are located at the peripheral area B. The spacing is less than 5 µm. For example, the spacing is 0.5 µm, 1 µm, 1.5 µm, 2 µm, 2.5 µm, 3 µm, 3.5 µm, 4 µm or 4.5 µm.

In some embodiments, the spacing is ranging from 0.5 µm to 2.5 µm. A large distance will occupy a relatively large peripheral area. A short distance will not effectively reduce the electromagnetic induction, and will reduce the protection effect of the protective structure.

In some embodiments, the semiconductor structure also includes a second dielectric layer 300 and a third protective structure 302. The second dielectric layer 300 is located on the first dielectric layer 200. The third protective structure 302 is located in the second dielectric layer 300. The projection of the third protective structure 302 and the projection of the second protective structure 202 in the direction perpendicular to the surface of the substrate 100 are at least partially overlapped. The projection of the third protective structure 302 and the projection of the first protective structure 102 in the direction along the surface of the substrate 100 are at least partially overlapped.

In some embodiments, the semiconductor structure also includes a third dielectric layer 400 and a fourth protective structure 402. The third dielectric layer 400 is located on the second dielectric layer 300. The fourth protective structure 402 is located in the third dielectric layer 400 and the second dielectric layer 300. The projection of the fourth protective structure 402 and the projection of the third protective structure 302 in the direction perpendicular to the surface of the substrate 100 are at least partially overlapped. The projection of the fourth protective structure 402 and the projection of the second protective structure 202 in the direction along the surface of the substrate 100 are at least partially overlapped.

In some embodiments, the semiconductor structure also includes an insulating layer 303. The insulating layer 30 is located between the second protective structure 202 and the fourth protective structure 402.

In some embodiments, the semiconductor structure also includes a second air gap 703. The second air gap 703 is located between the fourth protective structure 402 and the third protective structure 302.

In some embodiments, the semiconductor structure also includes the first connecting member 101, the second connecting member 201, the third connecting member 301 and the fourth connecting member 401 respectively located in the substrate 100, the first dielectric layer 200, the second dielectric layer 300 and the third dielectric layer 400 of the chip area A and electrically connected. The width of the third connecting member 301 is less than that of the second connecting member 201 and that of the fourth connecting member 401. The second protective structure 202 and the fourth protective structure 402 are formed at a side away from the chip area A, and the third protective structure 302 is formed at a side close to the chip area A.

The semiconductor structure provided in the disclosure can reduce the electromagnetic induction generated in the protective structure during chip operation through the segmented protective structure, so as to reduce the interference to the normal operation of the chip and improve the performance of the chip.

Although the disclosure has been described with reference to several exemplary embodiments, it should be understood that the terms used are illustrative and exemplary rather than restrictive. Since the disclosure may be concretely implemented in various forms without departing from the spirit or essence of the disclosure, it should be understood that the above embodiments are not limited to any of the foregoing details, but should be widely interpreted within the spirit and scope defined by the appended claims. Therefore, all changes and modifications falling within the scope of the claims or their equivalents should be covered by the appended claims.

The invention claimed is:

1. A method for manufacturing a semiconductor structure, comprising:
   providing a substrate, a first protective structure being formed in the substrate;
   forming a first dielectric layer on the substrate; and
   forming a second protective structure in the first dielectric layer and the substrate, wherein the substrate comprises a chip area and a peripheral area, and the first protective structure and the second protective structure are located at the peripheral area; and a projection of the second protective structure and a projection of the first protective structure in a direction perpendicular to a surface of the substrate are at least partially overlapped, and there is a spacing between a projection of the second protective structure and a projection of the first protective structure in a direction along the surface of the substrate;
   forming a second dielectric layer on the first dielectric layer;
   forming a third protective structure in the second dielectric layer, wherein a projection of the third protective structure and the projection of the second protective structure in the direction perpendicular to the surface of the substrate are at least partially overlapped, and a projection of the third protective structure and the projection of the first protective structure in the direction along the surface of the substrate are at least partially overlapped;

forming a third dielectric layer on the second dielectric layer;

forming a fourth protective structure in the third dielectric layer and the second dielectric layer, wherein a projection of the fourth protective structure and the projection of the third protective structure in the direction perpendicular to the surface of the substrate are at least partially overlapped, and a projection of the fourth protective structure and the projection of the second protective structure in the direction along the surface of the substrate are at least partially overlapped; and respectively and sequentially forming a first connecting member, a second connecting member, a third connecting member and a fourth connecting member, which are electrically connected, in the substrate, the first dielectric layer, the second dielectric layer and the third dielectric layer of the chip area, wherein a width of the third connecting member is less than a width of the second connecting member and a width of the fourth connecting member, wherein the second protective structure and the fourth protective structure are formed at a side away from the chip area, and the third protective structure is formed at a side close to the chip area; and, wherein forming a second protective structure in the first dielectric layer and the substrate and forming a fourth protective structure in the third dielectric layer and the second dielectric layer comprise:

forming a third protective opening at the third dielectric layer, the second dielectric layer and the first dielectric layer, wherein the third protective opening penetrates through the third dielectric layer, the second dielectric layer and the first dielectric layer, and a bottom of the third protective opening is located in the substrate;

forming the second protective structure by filling the third protective opening with a first conductive material;

forming an insulating layer on the second protective structure; and forming the fourth protective structure on the insulating layer.

2. The method according to claim 1, further comprising: forming a first air gap between the first protective structure and the second protective structure.

3. The method according to claim 1, wherein the spacing is less than 5 μm.

4. The method according to claim 1, further comprising: forming a second air gap between the fourth protective structure and the third protective structure.

5. A semiconductor structure, comprising:

a substrate, a first protective structure being formed in the substrate; and a first dielectric layer located on the substrate, a second protective structure being formed in the first dielectric layer, wherein the substrate comprises a chip area and a peripheral area, and the first protective structure and the second protective structure are located at the peripheral area, and a projection of the second protective structure and a projection of the first protective structure in a direction perpendicular to a surface of the substrate are at least partially overlapped, and there is a spacing between a projection of the second protective structure and a projection of the first protective structure in a direction along the surface of the substrate;

a second dielectric layer located on the first dielectric layer;

a third protective structure located in the second dielectric layer, wherein a projection of the third protective structure and the projection of the second protective structure in the direction perpendicular to the surface of the substrate are at least partially overlapped, and a projection of the third protective structure and the projection of the first protective structure in the direction along the surface of the substrate are at least partially overlapped;

a third dielectric layer located on the second dielectric layer;

a fourth protective structure located in the third dielectric layer and the second dielectric layer, wherein a projection of the fourth protective structure and the projection of the third protective structure in the direction perpendicular to the surface of the substrate are at least partially overlapped, and a projection of the fourth protective structure and the projection of the second protective structure in the direction along the surface of the substrate are at least partially overlapped; and an insulating layer located between the second protective structure and the fourth protective structure.

6. The semiconductor structure according to claim 5, further comprising:

a first air gap, located between the first protective structure and the second protective structure.

7. The semiconductor structure according to claim 5, wherein the spacing is less than 5 μm.

8. The semiconductor structure according to claim 5, further comprising:

a second air gap located between the fourth protective structure and the third protective structure.

9. The semiconductor structure according to claim 5, further comprising:

a first connecting member, a second connecting member, a third connecting member and a fourth connecting member, respectively located in the substrate, the first dielectric layer, the second dielectric layer and the third dielectric layer of the chip area and electrically connected, wherein a width of the third connecting member is less than a width of the second connecting member and a width of the fourth connecting member, and wherein the second protective structure and the fourth protective structure are formed at a side away from the chip area, and the third protective structure is formed at a side close to the chip area.

* * * * *